(12) United States Patent
Cho et al.

(10) Patent No.: US 8,305,818 B2
(45) Date of Patent: *Nov. 6, 2012

(54) MEMORY DEVICE AND METHOD FOR ESTIMATING CHARACTERISTICS OF MULTI-BIT PROGRAMMING

(75) Inventors: Kyoung Lae Cho, Yongin-si (KR); Seung-Hwan Song, Incheon (KR); Yoon Dong Park, Gyeonggi-do (KR); Jun Jin Kong, Yongin-si (KR); Jae-Hong Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 13/303,353

(22) Filed: Nov. 23, 2011

(65) Prior Publication Data

US 2012/0069654 A1    Mar. 22, 2012

Related U.S. Application Data

(63) Continuation of application No. 12/801,505, filed on Jun. 11, 2010, now Pat. No. 8,085,599, which is a continuation of application No. 12/213,657, filed on Jun. 23, 2008, now Pat. No. 7,746,702.

(30) Foreign Application Priority Data

Jan. 8, 2008  (KR) .................. 10-2008-0002230

(51) Int. Cl.
*G11C 11/34*  (2006.01)
(52) U.S. Cl. ............ 365/185.24; 365/185.2; 365/185.03

(58) Field of Classification Search ............. 365/185.24, 365/185.2, 185.03
See application file for complete search history.

(56) References Cited

U.S. PATENT DOCUMENTS

| | | | |
|---|---|---|---|
| 5,912,836 A | 6/1999 | Liu et al. | |
| 6,058,060 A | 5/2000 | Wong | |
| 6,278,633 B1 | 8/2001 | Wong et al. | |
| 6,490,204 B2 | 12/2002 | Bloom et al. | |
| 6,798,698 B2 * | 9/2004 | Tanaka et al. | 365/185.22 |
| 6,813,572 B2 | 11/2004 | Satya et al. | |
| 7,286,394 B2 * | 10/2007 | Ooishi | 365/158 |
| 7,307,878 B1 | 12/2007 | Lee et al. | |
| 7,746,702 B2 * | 6/2010 | Cho et al. | 365/185.24 |
| 8,085,599 B2 * | 12/2011 | Cho et al. | 365/185.24 |
| 2002/0110019 A1 | 8/2002 | Satoh et al. | |

FOREIGN PATENT DOCUMENTS

KR    100732631 B1    6/2007

* cited by examiner

*Primary Examiner* — Son Dinh
(74) *Attorney, Agent, or Firm* — Harness, Dickey & Pierce, P.L.C.

(57) ABSTRACT

Memory devices and/or methods that may estimate characteristics of multi-bit cell are provided. A memory device may include: a multi-bit cell array; a monitoring unit to extract a threshold voltage change over time value for reference threshold voltage states selected from a plurality of threshold voltage states corresponding to data stored in the multi-bit cell array; and an estimation unit to estimate a threshold voltage change over time values for the plurality of threshold voltage states based on the extracted threshold voltage change. Through this, it is possible to monitor a change over time of threshold voltages of a memory cell.

20 Claims, 5 Drawing Sheets

MEMORY DEVICE AND METHOD FOR ESTIMATING CHARACTERISTICS OF MULTI-BIT PROGRAMMING

PRIORITY STATEMENT

This application is a continuation of and claims priority under 35 U.S.C. §§120/121 to U.S. patent application Ser. No. 12/801,505, filed on Jun. 11, 2010, now U.S. Pat. No. 8,085,599 which is a continuation of and claims priority under 35 U.S.C. §§120/121 to U.S. patent application Ser. No. 12/213,657, filed on Jun. 23, 2008, now U.S. Pat. No. 7,746,702 which claims priority under 35 U.S.C. §119 from Korean Patent Application No. 10-2008-0002230, filed on Jan. 8, 2008, in the Korean Intellectual Property Office (KIPO), the entire contents of which are incorporated herein by reference.

BACKGROUND

1. Field

Example embodiments relate to methods of estimating characteristics of memory cells of memory devices. Also, example embodiments relate to apparatuses and/or methods that may estimate characteristics of Multi-Level Cells (MLCs) (or Multi-Bit Cells (MBCs) of MLC memory devices.

2. Description of Related Art

A single-level cell (SLC) memory device may store one bit of data in a single memory cell. The SLC memory may be referred to as a single-bit cell (SBC) memory. The SLC memory may store and read data of one bit at a voltage level included in two distributions that may be divided by a threshold voltage level programmed in a memory cell. The programmed threshold voltage may have a distribution within a certain range due to a fine electric characteristic difference between the SLC memories. For example, when a voltage level read from the memory cell is greater than 0.5V and less than 1.5V, it may be determined that the data stored in the memory cell has a logic value of "1". When the voltage level read from the memory cell is greater than 2.5V and less than 3.5V, it may be determined that the data stored in the memory cell has a logic value of "0". The data stored in the memory cell may be classified depending on the difference between cell currents and/or cell voltages during the reading operations.

Meanwhile, a multi-level cell (MLC) memory device that may store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and a read-failure rate may increase. To store 'm' bits in a single memory cell, 2 m voltage level distributions may be required. But, since the voltage window for a memory device may be limited, the difference in threshold voltage between adjacent bits may decrease as 'm' increases, causing the read-failure rate to increase. For this reason, it may be difficult to improve storage density using the MLC memory device according to a conventional art.

Also, a portion of a charge generating the threshold voltage of the data in an SLC or an MLC may be discharged over time due to a leakage path after being programmed. The threshold voltage of the SLC or the MLC may be changed by a discharge mechanism of a partial charge as time passes after being programmed. Since accurate information about the threshold voltage in the MLC is required, accurately estimating a change of the threshold voltage over time is very important.

SUMMARY

Example embodiments may provide apparatuses and/or methods that may estimate changes over time of programmed threshold voltages of multi-level cells (or multi-bit cells).

Example embodiments may also provide estimation models that may estimate changes over time of programmed threshold voltages of multi-level cells (or multi-bit cells).

Example embodiments may also provide apparatuses and/or methods that may estimate changes over time of programmed threshold voltages of multi-level cells (or multi-bit cells) and may reduce errors when reading multi-bit data.

According to example embodiments, a memory device may include: a multi-bit cell array; a monitoring unit to extract threshold voltage change over time values of reference threshold voltage states selected from a plurality of threshold voltage states corresponding to data stored in the multi-bit cell array; and an estimation unit to estimate a threshold voltage change over time values for the plurality of non-reference threshold voltage states based on the extracted threshold voltage change values.

According to example embodiments, a memory device may include: a multi-bit cell array; and a data detection unit to read a multi-bit cell of a first threshold voltage state using a first read voltage, and to read a multi-bit cell of a second threshold voltage state using a second read voltage after data is programmed in the multi-bit cell array. According to example embodiments, the data detection unit may read the multi-bit cell of the first threshold voltage state using a third read voltage, and read the multi-bit cell of the second threshold voltage state using a fourth read voltage after a passage of time after reading the multi-bit cell of the multi-bit cell array using the first read voltage and the second read voltage. A difference between the fourth read voltage and the second read voltage may be greater than a difference between the third read voltage and the first read voltage.

According to example embodiments, a method of estimating a characteristic of a multi-bit cell may include: selecting a plurality of reference threshold voltage states from a plurality of threshold voltage states corresponding to data stored in a multi-bit cell array; extracting threshold voltage change over time values for the plurality of reference threshold voltage states; and estimating threshold voltage change over time values for the plurality of non-reference threshold voltage states based on the extracted threshold voltage change values.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Figure 1:
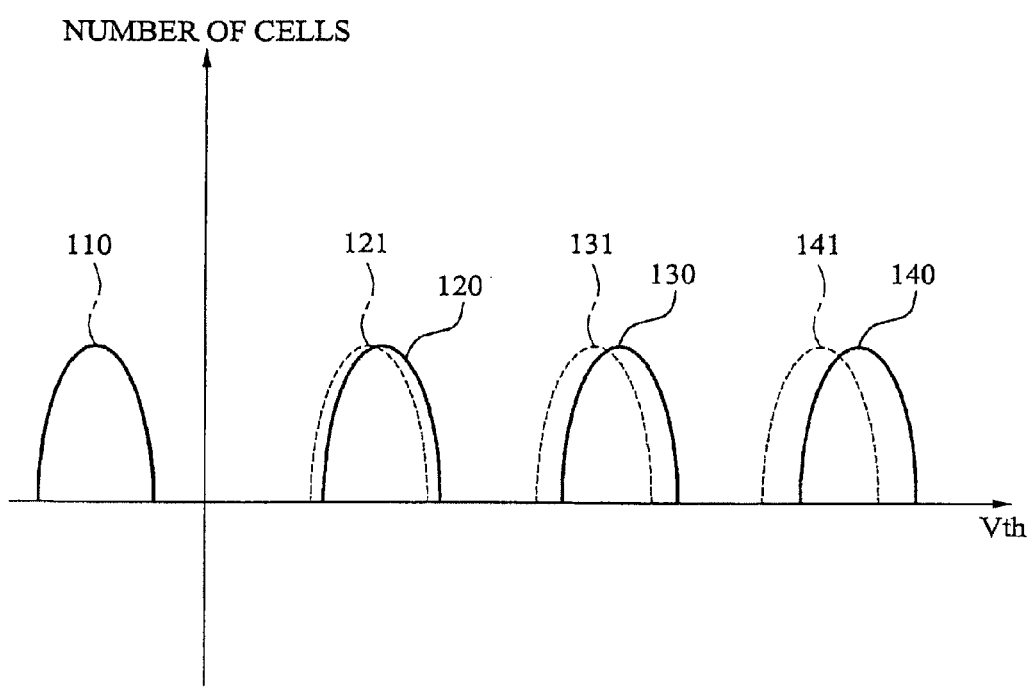
FIG. 1 illustrates a threshold voltage change over time of multi-bit cells of a memory device.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Reference will now be made to example embodiments, which are illustrated in the accompanying drawings, wherein like reference numerals may refer to like components throughout.

Generally, programming of a non-volatile memory may be performed by changing a threshold voltage of a memory cell. The threshold voltage of the memory cell may denote data stored in the memory cell. The threshold voltage of the memory cell may have an error of a predetermined range and a distribution state.

After the data is stored in the non-volatile memory, the threshold voltage of the programmed memory cell may be changed by a mechanism including a charge loss in a floating gate and the like.

Example embodiments provide a memory device and a monitoring method for monitoring a change of the threshold voltage of the memory cell, and a memory programming apparatus and method that may minimize area overhead when verifying an error of the data stored in the memory cell.

FIG. 1 illustrates threshold voltage change over time of multi-bit cells of a memory device.

Referring to FIG. 1, a horizontal axis denotes threshold voltages, and a vertical axis denotes a number of multi-bit cells having the threshold voltages.

As described above, the threshold voltages of the memory cells form a distribution state of a predetermined range. A distribution state 110 of the threshold voltages denotes a distribution of the threshold voltages of the multi-bit cells in which data "11" is programmed. A distribution state 120 denotes a distribution of the threshold voltages of the multi-bit cells in which data "10" is programmed. A distribution state 130 denotes a distribution of the threshold voltages of the multi-bit cells in which data "00" is programmed. A distribution state 140 denotes a distribution of the threshold voltages of the multi-bit cells in which data "01" is programmed.

The distribution state 110, the distribution state 120, the distribution state 130, and the distribution state 140 denote distributions of the threshold voltages of the multi-bit cells immediately after the data are programmed.

When an amount of time passes after the data is programmed, the threshold voltages of the multi-bit cells may be changed by a mechanism including a charge loss in a floating gate and the like.

There are several causes of changing the threshold voltages of the multi-bit cells from the threshold voltages immediately after being programmed, and it is known that the above-described charge loss may reduce the threshold voltages of the multi-bit cells.

A distribution state 141 denotes an example of a distribution of the threshold voltages that the multi-bit cells in which data "01" is programmed may have after a passage of an amount of time.

A distribution state 131 denotes an example of a distribution of the threshold voltages that the multi-bit cells in which data "00" is programmed may have after a passage of the amount of time.

A distribution state 121 denotes an example of a distribution of the threshold voltages that the multi-bit cells in which data "10" is programmed may have after a passage of the amount of time.

It is known that the threshold voltage change by the charge loss mechanism may increase as the threshold voltage increases. A difference between the distribution state 141 and the distribution state 140 may be greater than a difference between the distribution state 131 and the distribution state 130, and a difference between the distribution state 131 and the distribution state 130 may be greater than a difference between the distribution state 121 and the distribution state 120.

Figure 2:
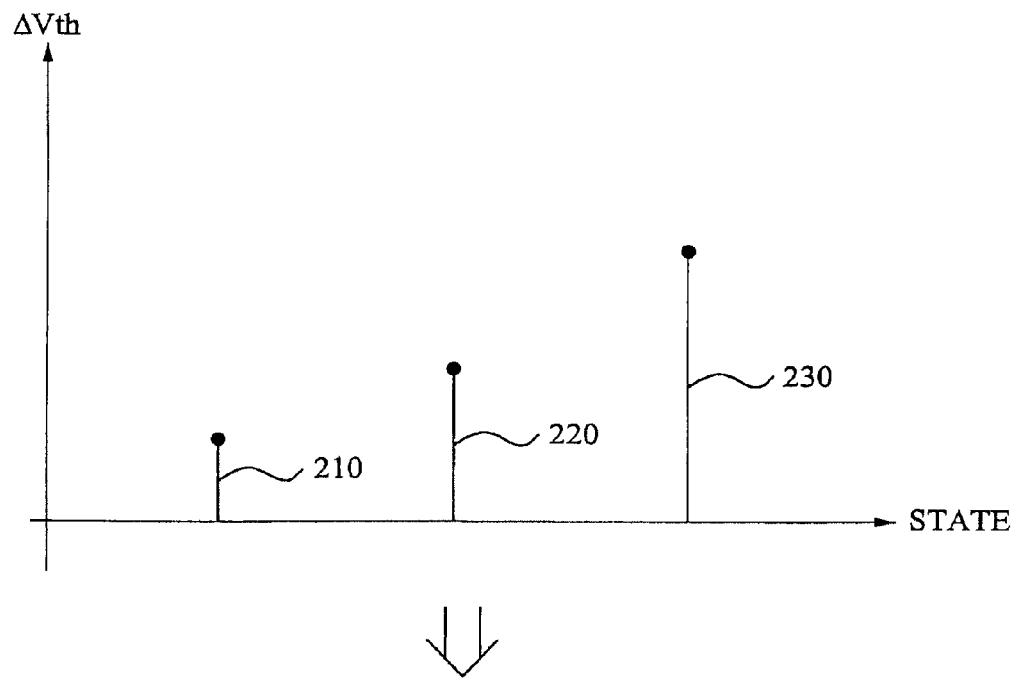
FIG. 2 illustrates a method of estimating a characteristic of a multi-bit cell according to at least one example embodiment.
Figure 2:
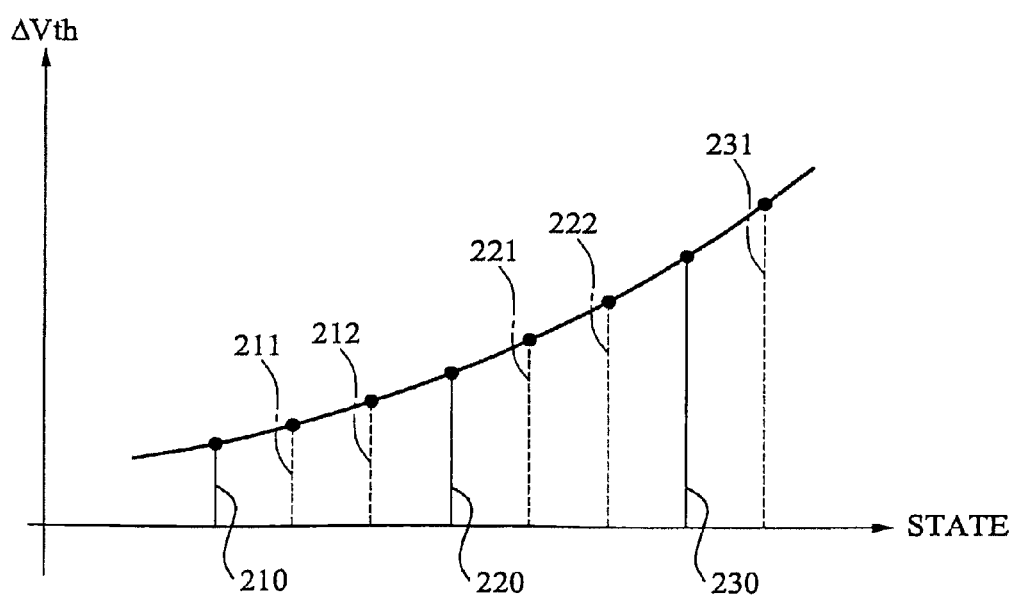

FIG. 2 illustrates a method of estimating a characteristic of a multi-bit cell according to at least one example embodiment.

Referring to FIG. 2, a threshold voltage change amount with respect to three reference threshold voltage states is measured.

In the example embodiment illustrated in FIG. 2, it is assumed that eight different distribution states exist. However, it will be understood that the methods according to example embodiments may be applied to any number of distribution states for example, 2, 4 or 16. Since each distribution state denotes a distribution state of the threshold voltages, this is referred to as a threshold voltage state.

The estimation method may include selecting three reference threshold voltage states, and measuring a threshold voltage change over time value for each of the selected reference threshold voltage states.

The estimation method may include selecting a first threshold voltage state as a first reference threshold voltage state, selecting a fourth threshold voltage state as a second reference threshold voltage state, and selecting a seventh threshold voltage state as a third reference threshold voltage state.

The estimation method may include monitoring threshold voltages of multi-bit cells corresponding to the first reference threshold voltage state, and finding a first change amount 210 over time of the threshold voltages.

The estimation method may include monitoring threshold voltages of multi-bit cells corresponding to the second reference threshold voltage state, and finding a second change amount 220 over time of the threshold voltages.

The estimation method may include monitoring threshold voltages of multi-bit cells corresponding to the third reference threshold voltage state, and finding a third change amount 230 over time of the threshold voltages.

The estimation method may include estimating, based on the first change amount 210, the second amount 220, and the third change amount 230 of the threshold voltages, a change amount over time for each of the remaining five threshold voltage states excluding the three reference threshold voltage states.

The estimation method may include estimating a change amount of a second threshold voltage state 211, a change amount of a third threshold voltage state 212, a change amount of a fifth threshold voltage state 221, a change amount of a sixth threshold voltage state 222, and a change amount of an eighth threshold voltage state 231 based on the first change amount 210, the second change amount 220, and the third change amount 230.

The estimation method may include generating a characteristic change model to estimate the threshold voltage change amount of each of non-reference threshold voltage states using a curve fitting scheme based on the first change amount 210, the second change amount 220, and the third change amount 230.

The estimation method may include predicting the threshold voltage change amount of each of the threshold voltage states using the characteristic change model acquired experimentally in advance. According to example embodiments, the estimation method may include specifying a coefficient of the characteristic change model, which may be acquired in advance using the curve fitting scheme, based on the first change amount 210, the second amount 220, and the third change amount 230.

The characteristic change model may be a linearly increasing model or a linearly decreasing model based on a value of the threshold voltage. The characteristic change model may be a non-linear function model including a quadratic function, a cubic function, and the like, that non-linearly increases or decreases based on the value of the threshold voltage.

The characteristic change model may be a multinomial function model based on the value of the threshold voltage. The characteristic change model may be an exponential function based on the value of the threshold voltage.

An effort to increase a number of bits of the data stored in a single multi-bit cell for increasing a data storage density continues. As the number of bits of the data stored in the single multi-bit cell increases, a number of threshold voltage states generated in a multi-bit cell array may increase exponentially.

Specifically, two threshold voltage states may be necessary for storing 1-bit data in a single cell, however, four threshold voltage states may be necessary for storing 2-bit data in the single cell, and 16 threshold voltage states may be necessary for storing 4-bit data in the single cell.

As the number of threshold voltage states increases, a significant time may be required for measuring the change amount of all threshold voltage states, and a configuration for this may become complex. According to example embodiments, a method of estimating a characteristic of a multi-bit cell may include selecting only some threshold voltage states as reference voltage states rather than all threshold voltage states as the reference threshold voltage states, measuring the change amount of the selected reference threshold voltage states, and estimating the change amount of all threshold voltage states based on the measured change amount.

The estimation method may reduce complexity of the configuration, reduce a time of reading the multi-bit cells, and reduce a number of reads of the multi-bit cells.

Figure 3:
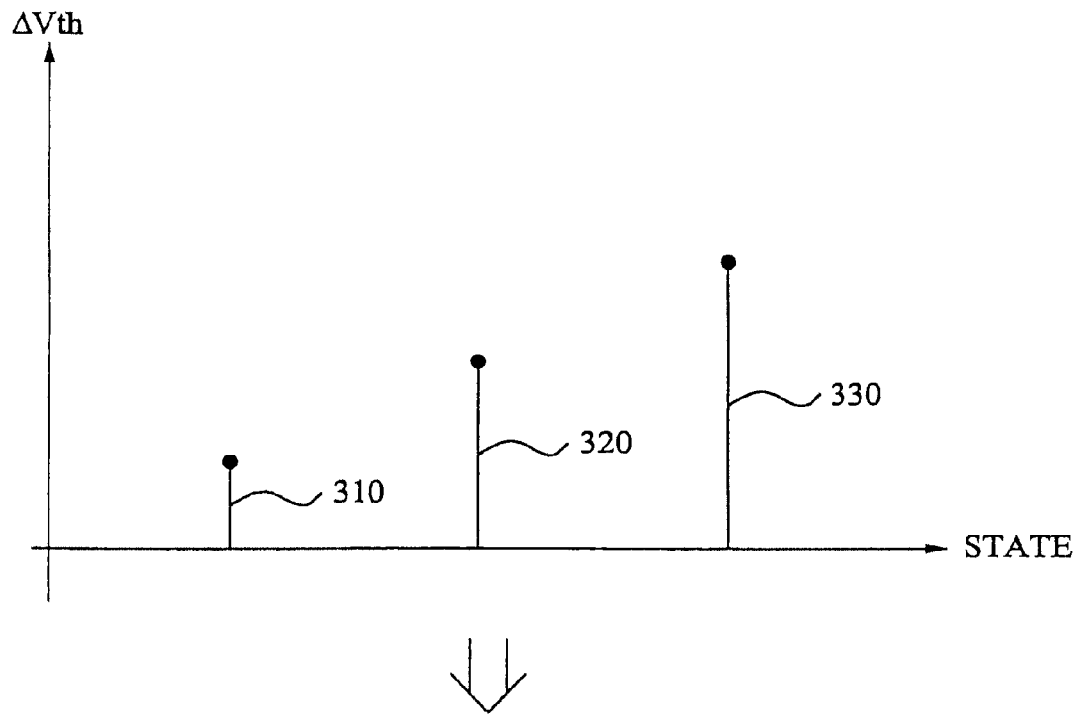
FIG. 3 illustrates a method of estimating a characteristic of a multi-bit cell according to at least one example embodiment.
Figure 3:
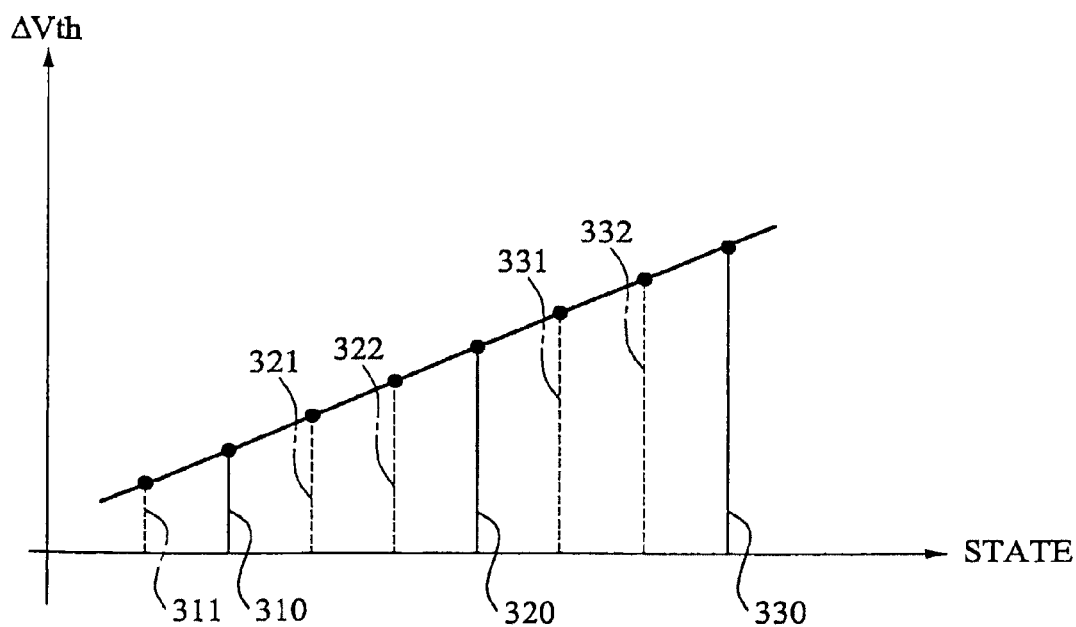

FIG. 3 illustrates a method of estimating a characteristic of a multi-bit cell according to at least one example embodiment.

Referring to FIG. 3, a threshold voltage change amount with respect to three reference threshold voltage states may be measured.

In the example embodiment illustrated in FIG. 3, it is assumed that eight different distribution states exist. However, it will be understood that the methods according to example embodiments may be applied to any number of distribution states for example, 2, 4 or 16.

The estimation method may include selecting three reference threshold voltage states, and measuring a threshold voltage change over time value for each of the selected reference threshold voltage states.

The estimation method may include selecting a second threshold voltage state as a first reference threshold voltage state, selecting a fifth threshold voltage state as a second reference threshold voltage state, and selecting an eighth threshold voltage state as a third reference threshold voltage state.

The estimation method may include monitoring threshold voltages of multi-bit cells corresponding to the first reference threshold voltage state, and finding a first change amount 310 over time of the threshold voltages.

The estimation method may include monitoring threshold voltages of multi-bit cells corresponding to the second reference threshold voltage state, and finding a second change amount 320 over time of the threshold voltages.

The estimation method may include monitoring threshold voltages of multi-bit cells corresponding to the third reference threshold voltage state, and finding a third change amount 330 over time of the threshold voltages.

The estimation method may include estimating, based on the first change amount 310, the second amount 320, and the third change amount 330 of the threshold voltages, a change amount over time of the remaining five threshold voltage states excluding the three reference threshold voltage states.

The estimation method may include estimating a change amount of a first threshold voltage state 311, a change amount of a third threshold voltage state 321, a change amount of a fourth threshold voltage state 322, a change amount of a sixth threshold voltage state 331, and a change amount of a seventh threshold voltage state 332 based on the first change amount 310, the second change amount 320, and the third change amount 330.

The estimation method may include generating a characteristic change model to estimate the threshold voltage change amount of each of threshold voltage states using a curve fitting scheme based on the first change amount 310, the second change amount 320, and the third change amount 330.

In at least the example embodiment illustrated in FIG. 3, the estimation method may include generating a linearly increasing or decreasing characteristic change model according to a value of the threshold voltage based on the first change amount 310, the second change amount 320, and the third change amount 330.

Figure 4:
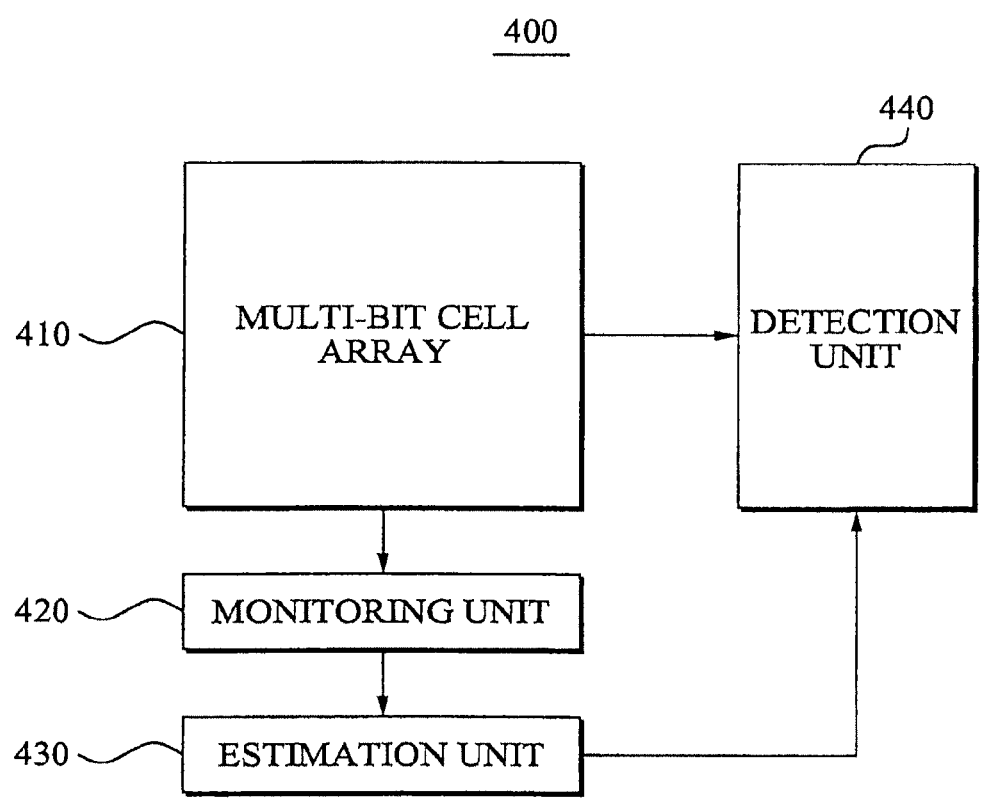
FIG. 4 is a diagram illustrating a memory device according to at least one example embodiment.

FIG. 4 is a diagram illustrating a memory device 400 according to example embodiments.

Referring to FIG. 4, according to example embodiments, the memory device 400 includes a multi-bit cell array 410, a monitoring unit 420, an estimation unit 430, and a detection unit 440.

The monitoring unit 420 may extract threshold voltage change over time values for reference threshold voltage states selected from a plurality of threshold voltage states corresponding to data stored in the multi-bit cell array 410.

The estimation unit 430 may estimate a threshold voltage change over time of the plurality of threshold voltage states based on the extracted threshold voltage change.

The detection unit 440 may reads multi-bit data stored in the multi-bit cell array 410 based on the estimated threshold voltage change.

The monitoring unit 420 may extract a first threshold voltage change over time of a first reference threshold voltage state and a second threshold voltage change over time of a second reference threshold voltage state. According to example embodiments, the estimation unit 430 may estimate the threshold voltage change over time values of the plurality of threshold voltage states by performing a linear approximation based on the first threshold voltage change and the second threshold voltage change.

The monitoring unit 420 may extract a first threshold voltage change over time of a first reference threshold voltage state, a second threshold voltage change over time of a second reference threshold voltage state, and a third threshold voltage change over time of a third reference threshold voltage state. According to example embodiments, the estimation unit 430 may estimate the threshold voltage change over time values of the plurality of threshold voltage states by performing a quadratic function approximation based on the first threshold voltage change, the second threshold voltage change, and the third threshold voltage change.

The estimation unit 430 may estimate, based on the extracted threshold voltage change values and a number of reads of the data from the multi-bit cell array 410, the threshold voltage change over time values of the plurality of threshold voltage states.

The estimation unit 430 may estimate, based on the extracted threshold voltage change values and a number of writes and erasures of the data from the multi-bit cell array 410, the threshold voltage change over time values of the plurality of threshold voltage states.

The estimation unit 430 may estimate, based on the extracted threshold voltage change values and an elapsed time after the program of the data in the multi-bit cell array 410, the threshold voltage change over time values of the plurality of threshold voltage states.

The estimation unit 430 may generate error information by error control codes (ECC) decoding of the data read from the multi-bit cell array 410, and estimate the threshold voltage change over time values of the plurality of threshold voltage states based on the extracted threshold voltage change values and the error information.

The monitoring unit 420 may extract the threshold voltage change over time values of the reference threshold voltage states by adjusting read voltage levels with respect to the multi-bit cell array 410. According to example embodiments, the memory device 400 may store, in the multi-bit cell array 410, a number of multi-bit cells corresponding to each of the reference threshold voltage states. The monitoring unit 420 may extract the threshold voltage change over time values of the reference threshold voltage states based on the number of multi-bit cells corresponding to each of the reference threshold voltage states, the number being stored in the multi-bit cell array 410.

The monitoring unit 420 and the detection unit 440 may be embodied as a peripheral circuit around the multi-bit cell array 410. The monitoring unit 420 may detect the threshold voltages of the multi-bit cells of the multi-bit cell array 410 using variable read voltage levels. The monitoring unit 420 may compare the variable read voltage levels and the threshold voltages of the multi-bit cells and detect a number of multi-bit cells having the threshold voltages higher than each of the variable read voltage levels.

Referring to FIG. 3 again, an example embodiment of FIG. 4 is described. A memory device 400 may store, in the multi-bit cell array 410, a number of first multi-bit cells programmed to correspond to a first reference voltage state, a number of second multi-bit cells programmed to correspond to a second reference voltage state, and a number of third multi-bit cells programmed to correspond to a third reference voltage state as meta data.

The monitoring unit 420 may store information about a first read voltage level that may discriminate the first reference voltage state immediately after data is programmed, from the first threshold voltage state immediately after the data is programmed. After a passage of an amount of time from when the data is programmed, the monitoring unit 420 may count a number of multi-bit cells having the threshold voltages higher than the first read voltage level. According to example embodiments, the monitoring unit 420 may calculate a number of multi-bit cells of the first reference voltage state from the counted number of multi-bit cells, and determine whether the calculated number of multi-bit cells of the first reference voltage state is equal to a number of first multi-bit cells stored as the meta data.

When it is determined that the calculated number of multi-bit cells of the first reference voltage state is equal to the number of first multi-bit cells stored as the meta data, the monitoring unit 420 may determine that the first read voltage level is still valid.

When it is determined that the calculated number of multi-bit cells of the first reference voltage state is less than the number of first multi-bit cells stored as the meta data, the monitoring unit 420 may set a new first read voltage level lower than the first read voltage level. The monitoring unit 420 may count a number of multi-bit cells having the threshold voltages higher than the set new first read voltage level. According to example embodiments, the monitoring unit 420 may recalculate a number of multi-bit cells of the first reference voltage state from the counted number of multi-bit cells, and determine whether the recalculated number of multi-bit cells of the first reference voltage state is equal to a number of first multi-bit cells stored as the meta data.

Repeating the above-described process, the monitoring unit 420 may search for the new first read voltage level of enabling the number of first multi-bit cells stored as the meta data to be equal to the calculated number of multi-bit cells of the first reference voltage state. The monitoring unit 420 may calculate a difference between the retrieved new first read voltage level and the first read voltage level immediately after being programmed, and acquire the first change amount 310 of the threshold voltages of the first reference threshold voltage state.

Similarly, the monitoring unit 420 may acquire the second change amount 320 of the threshold voltages of the second reference voltage state and the third change amount 330 of the threshold voltages of the third reference voltage state. The monitoring unit 420 may estimate a change amount of the threshold voltages of the remaining five threshold voltage states based on the acquired first change amount 310, the acquired second change amount 320, and the acquired third change amount 330, and adjust the read voltage levels with respect to the remaining five threshold voltage states based on the estimated change amount.

The detection unit 440 may detect the threshold voltages of the multi-bit cells of the multi-bit cell array 410 using the read voltage levels adjusted by the monitoring unit 420, and extract the data stored in the multi-bit cells from the detected threshold voltages.

Another example embodiment is described with reference to FIG. 1 again. A memory device according to another example embodiment (not illustrated) may include a multi-bit cell array and a data detection unit.

The data detection unit may read first multi-bit cells of the first threshold voltage state 120 immediately after being programmed using a first read voltage V1. The data detection unit may read second multi-bit cells of the second threshold voltage state 140 immediately after being programmed using a second read voltage V2.

When an amount of time passes from a time when the data is programmed, the data detection unit may newly search for a read voltage level of the changed first threshold voltage state 121 and the changed second threshold voltage state 141. The data detection unit may search for a third read voltage V3 optimized for detecting the first multi-bit cells of the changed first threshold voltage state 121. The data detection unit may search for a fourth read voltage V4 optimized for detecting the second multi-bit cells of the changed second threshold voltage state 141.

The data detection unit may read the first multi-bit cells of the changed first threshold voltage state 121 using the third read voltage V3, and read the second multi-bit cells of the changed second threshold voltage state 141 using the fourth read voltage V4. According to example embodiments, a relation of $|V4-V2|>|V3-V1|$ may exist.

Figure 5:
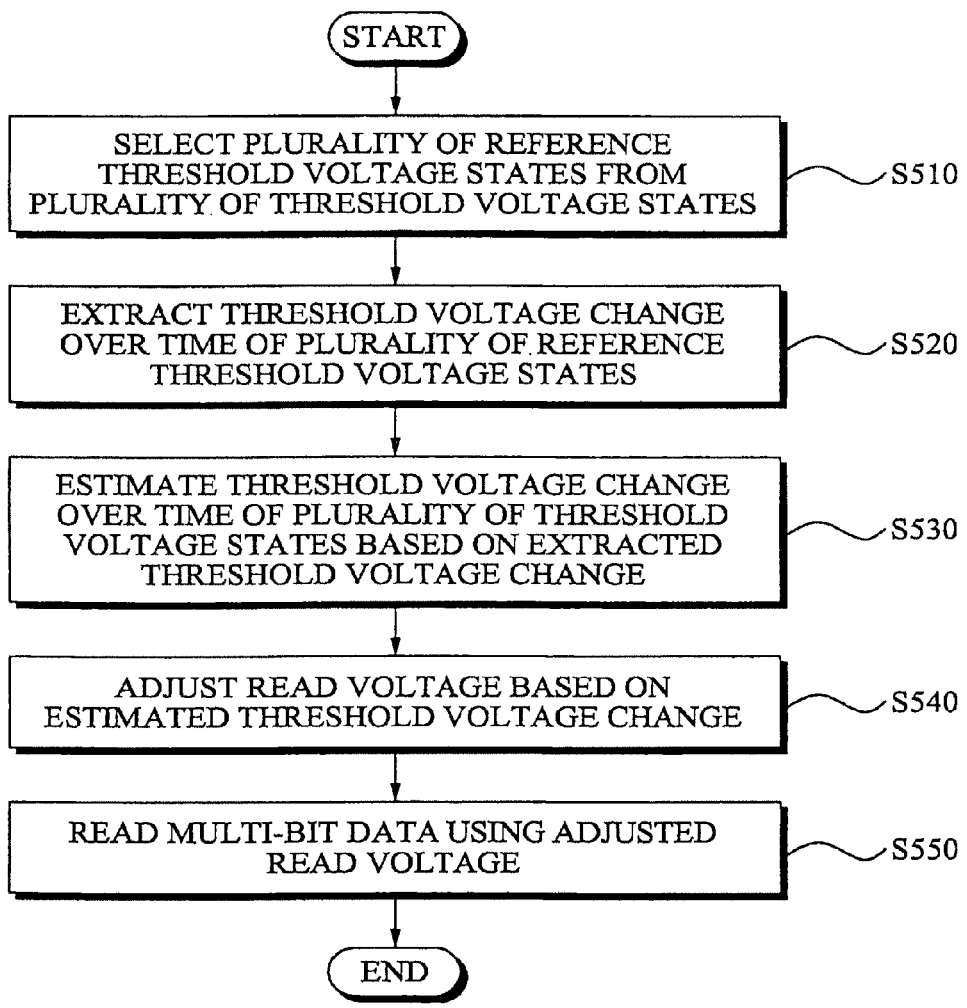
FIG. 5 is a flowchart illustrating a method of estimating a characteristic of a multi-bit cell according to at least one example embodiment.

FIG. 5 is a flowchart illustrating a method of estimating a characteristic of a multi-bit cell according to an example embodiment.

Referring to FIG. 5, in operation S510, the estimation method may include selecting a plurality of reference threshold voltage states from a plurality of threshold voltage states corresponding to data stored in a multi-bit cell array.

In operation S520, threshold voltage change over time values of the plurality of reference threshold voltage states may be extracted.

In operation S530, threshold voltage change over time values of the plurality of threshold voltage states may be estimated based on the extracted threshold voltage change.

In operation S540, a read voltage of the multi-bit cell array may be adjusted based on the estimated threshold voltage change.

In operation S550, multi-bit data stored in the multi-bit cell array may be read using the adjusted read voltage.

In operation S510, the plurality of threshold voltage states may be divided into a low level group, a medium level group, and a high level group based on the level of the threshold voltage of the plurality of threshold voltage states.

In operation S510, one threshold voltage state may be selected as the reference threshold voltage state from each of the divided groups.

According to example embodiments. reliable reference data, with respect to the change of the threshold voltage states, may be acquired by respectively selecting one reference threshold voltage state from the low level group, the medium level group, and the high level group based on the level of the threshold voltage of the plurality of threshold voltage states.

In operation S510, the plurality of threshold voltage states may be divided so that a number of threshold voltage states of the low level group may be greater than a number of threshold voltage states of the high level group. For example, when eight threshold voltage states exist, the plurality of threshold voltage states may be divided to include four threshold voltage states in the low level group, and to include two threshold voltage states in the medium level group, and to include two threshold voltage states in the high level group. When the plurality of threshold voltage states is divided as described above, a probability that the threshold voltage states having the high threshold voltage are selected as the reference threshold voltage state may increase. Since a charge loss mechanism may be significant in the multi-bit cells having the high threshold voltages, the estimation method may have an advantage if the estimation method extracts threshold voltage change information about the multi-bit cells having the high threshold voltages.

In operation S510, the estimation method may select the second threshold voltage state, the fifth threshold voltage state, and the seventh threshold voltage state as the reference threshold voltage states from the lowest threshold voltage state of eight threshold voltage states, and may select the sixth threshold voltage state, the seventh threshold voltage state, and the eighth threshold voltage state as the reference threshold voltage state.

In operation S530, the estimation method may generate an approximation model with respect to the extracted threshold voltage change over time values of the plurality of reference threshold voltage states using a linear approximation scheme or a polynomial approximation scheme with respect to the extracted threshold voltage change. According to example embodiments, in operation S530, the estimation method may reflect the extracted threshold voltage change on a predetermined approximation model and specify a coefficient of the approximation model using a curve fitting scheme.

The methods of estimating the characteristics of the multi-bit cells according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes of example embodiments, or they may be of the kind well-known and available to those having skill in the computer software arts. Examples of computer-readable media may include, for example, magnetic media such as hard disks, floppy disks, and magnetic tape; optical media such as CD ROM disks and DVD; magneto-optical media such as optical disks; and hardware devices that are specially configured to store and perform program instructions, for example read-only memory (ROM), random access memory (RAM), flash memory, and the like. Examples of program instructions may include both machine code, such as produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In this case, the memory controllers may be constructed to communicate with an external device for example, a host using any one of various types of interface protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that can maintain stored data even when power is cut off According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system according to example embodiments may include a microprocessor that is electrically connected with a bus, a user interface, a modem such as a baseband chipset, a memory controller, and a flash memory device. The flash memory device may store N-bit data via the memory controller. The N-bit data is processed or will be processed by the microprocessor and N may be 1 or an integer greater than 1. When the computing system is a mobile apparatus, a battery may be additionally provided to supply operation voltage of the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

The foregoing descriptions of example embodiments have been presented for purposes of illustration and description. They are not intended to be exhaustive or to limit example embodiments to the precise forms disclosed, and obviously many modifications and variations are possible in light of the above teaching.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

The invention claimed is:

1. A device comprising:
a multi-bit cell array; and
a controller configured to estimate a first threshold voltage change of a plurality of threshold voltage states corresponding to data stored in the multi-bit cell array based on a second threshold voltage change of at least one reference threshold voltage state selected from the plurality of threshold voltage states,
wherein the second threshold voltage change is based on a difference between a threshold voltage when data is programmed and a threshold voltage after a passage of an amount of time from when the data is programmed.

2. The device of claim 1, wherein the controller is configured to extract the second threshold voltage change of the at least one reference threshold voltage state by monitoring at least one threshold voltage of at least one multi-bit cell corresponding to the at least one reference threshold voltage state.

3. The device of claim 1, wherein the multi-bit cell array is configured to store a number of multi-bit cells programmed to correspond to each of the at least one reference threshold voltage state, and the controller is configured to extract the threshold voltage change of the at least one reference threshold voltage state based on the stored number of the multi-bit cells.

4. The device of claim 3, wherein the controller is configured to store the number of multi-bit cells programmed to correspond to each of the at least one reference threshold voltage state in the multi-bit cell array.

5. The device of claim 3, wherein the at least one reference voltage state includes at least two reference voltage states and the controller is configured to select a highest threshold voltage state and a lowest threshold voltage state from among the plurality of threshold voltage states as two of the at least two reference threshold voltage states.

6. The device of claim 1, wherein the controller is configured to estimate the threshold voltage change of the plurality of threshold voltage states using a characteristic change model acquired experimentally in advance.

7. A device comprising:
a multi-bit cell array; and
a detection unit configured to extract data stored in the multi-bit cells using read voltage levels of a plurality of threshold voltage states corresponding to the data stored in the multi-bit cell array,
wherein the detection unit is configured to adjust the read voltage levels of the plurality of threshold voltage states based on a threshold voltage change of at least one reference threshold voltage state selected from the plurality of threshold voltage states, the threshold voltage change being based on a difference between a threshold voltage when data is programmed and a threshold voltage after a passage of an amount of time from when the data is programmed.

8. The device of claim 7, further comprising:
a monitoring unit configured to monitor the threshold voltage change of the at least one reference threshold voltage state by monitoring threshold voltages of at least one multi-bit cell corresponding to the at least one reference threshold voltage state.

9. The device of claim 8, further comprising:
an estimation unit configured to estimate threshold voltage changes of the plurality of threshold voltage states using a characteristic change model acquired experimentally in advance.

10. The device of claim 7, further comprising:
an estimation unit configured to extract the threshold voltage change of the at least one reference threshold voltage state based on a number of multi-bit cells programmed to correspond to each of the reference threshold voltage states,
wherein the multi-bit cell array stores the number of the multi-bit cells.

11. The device of claim 10, wherein the estimation unit is configured to estimate threshold voltage changes of the plurality of threshold voltage states based on the extracted threshold voltage change.

12. The device of claim 10, wherein the estimation unit is configured to estimate threshold voltage changes of the plurality of threshold voltage states based on the extracted threshold voltage change and a number of writes and erasures from the multi-bit cell array.

13. The device of claim 10, wherein the estimation unit is configured estimate threshold voltage changes of the plurality of threshold voltage states based on the extracted threshold voltage change and an elapsed time after writing the plurality of threshold voltage states into the multi-bit cell array.

14. An operating method of a memory device, the method comprising:
extracting a first threshold voltage change of at least one reference threshold voltage state from a plurality of threshold voltage states stored in a multi-bit cell array;
sending the first threshold voltage change to a estimation unit;
estimating second threshold voltage changes of the plurality of threshold voltage states based on the received threshold voltage change;
reading data from the multi-bit cell array based on the estimated second threshold voltage changes.

15. The method of claim 14, wherein the threshold first voltage change and the second threshold voltage changes are respectively a difference between a threshold voltage when a data is programmed and a threshold voltage after a passage of an amount of time from when the data is programmed.

16. The method of claim 14, wherein the estimating step includes using a characteristic change model acquired experimentally in advance.

17. The method of claim 14, wherein the estimating step is based on the first threshold voltage change and a number of data read operations performed on the multi-bit cell array.

18. The method of claim 14, wherein the estimating step is based on the first threshold voltage change and a number of data write and erasure operations performed on the multi-bit cell array.

19. The method of claim 14, wherein the estimating step is based on the first threshold voltage change and an elapsed time after writing the plurality of threshold voltage states into the multi-bit cell array.

20. The method of claim 14, wherein the reading step includes adjusting read voltage levels based on the estimated second threshold voltage changes.

* * * * *